US006853241B2

(12) United States Patent
Fujimoto

(10) Patent No.: US 6,853,241 B2
(45) Date of Patent: Feb. 8, 2005

(54) SWITCHED-CAPACITOR AMPLIFIER AND ANALOG INTERFACE CIRCUIT FOR CHARGE COUPLED ELEMENT ADOPTING THE SAME

(75) Inventor: Yoshihisa Fujimoto, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 10/353,968

(22) Filed: Jan. 30, 2003

(65) Prior Publication Data

US 2003/0155967 A1 Aug. 21, 2003

(30) Foreign Application Priority Data

Feb. 20, 2002 (JP) ........................................ 2002-043783

(51) Int. Cl.[7] .............................................. H03F 1/02
(52) U.S. Cl. .............................. 330/9; 330/69; 327/124
(58) Field of Search ............................. 330/9, 69, 51, 330/86; 327/124

(56) References Cited

U.S. PATENT DOCUMENTS

| | | | | | |
|---|---|---|---|---|---|
| 4,609,877 | A | * | 9/1986 | Nicollini et al. | 330/9 |
| 4,697,152 | A | * | 9/1987 | Westwick | 330/9 |
| 5,410,270 | A | * | 4/1995 | Rybicki et al. | 330/9 |
| 6,661,283 | B1 | * | 12/2003 | Lee | 330/9 |

OTHER PUBLICATIONS

Razavi, Behad. Design of Analog CMOS Integrated Circuits. McGraw–Hill, pp. 416–423, 2000.

Nakamura, Katsu, et al. Digest of Technical Papers, 2000 IEEE International Solid–State Circuits Conference, pp. 190–191, Feb. 8, 2000.

Fujimoto, Yoshihisa, et al. Proceedings of the 28th European Solid–State Circuits Conference. pp. 363–366, 2002.

* cited by examiner

*Primary Examiner*—Henry Choe
(74) *Attorney, Agent, or Firm*—Birch, Stewart, Kolasch & Birch, LLP

(57) ABSTRACT

In the hold phase, two negative feedback circuits constituted by the negative feedback capacitors 6p and 6m and two positive feedback circuits constituted by positive feedback capacitors are provided between an input terminal and an output terminal of an operational amplifier. Here, in a sampling phase before a hold phase, charges according an input signal V1p is stored in each of the capacitors, and charges according to an input signal V1p are stored in each of the capacitors. As a result, a gain of the switched capacitor amplifier circuit is derived from $(Ca+C)/(Ca-Cx)$ wherein Ca indicates an electrostatic capacitance of the negative feedback capacitors, and Cx indicates an electrostatic capacitance of the positive feedback capacitors, and thus the gain can be increased without significantly increasing an electrostatic capacitance ratio.

16 Claims, 5 Drawing Sheets

SWITCHED-CAPACITOR AMPLIFIER AND ANALOG INTERFACE CIRCUIT FOR CHARGE COUPLED ELEMENT ADOPTING THE SAME

This nonprovisional application claims priority under 35 U.S.C. §119(a) on Patent Application No. 2002-43783 filed in Japan on Feb. 20, 2002, which is herein incorporated by reference.

FIELD OF THE INVENTION

The present invention relates to a switched capacitor amplifier, and more particularly relates to a switched capacitor amplifier which permits an increase in gain without significantly increasing an electrostatic capacitance ratio of a capacitor.

BACKGROUND OF THE INVENTION

Conventionally, switched capacitor amplifiers have been used in a variety of fields, for example, as a PGA (Programmable Gain Amplifier) for amplifying an analog signal as input via a CDS (Correlated Double Sampling) circuit from a CCD (Charge-Coupled Device) as disclosed in, for example, 2000 IEEE International Solid State Circuits Conference, Digest of Technical papers, pp190–191.

FIG. 5 shows a switched capacitor amplifier circuit 101 as an example of generally used conventional differential input and output circuits, wherein in the sampling interface, signals Vip and Vim as input as differential input signals Vi are input to input capacitors 107p and 107m via switches 108p and 108m respectively. On the other hand, in the sampling interface, input reset switches 104p and 104m are conducted, and the output terminals of the input capacitors 107p and 107m are connected to ground. With this structure, in the input capacitors 107p and 107m, stored are charges corresponding to the signals Vip and Vim respectively, and a non-inverting output terminal and an inverting output terminal of an operational amplifier 102 are reset to a ground level.

In the sampling interface, the non-inverting output terminal and the inverting output terminal of the operational amplifier 102 are reset by conducting an output reset switch 103 provided between the terminals. On the other hand, to the other end of a negative feedback capacitor 106p connected to the inverse input terminal of the operational amplifier 102, a reference voltage Verf is applied via a switch 105p.

In the hold phase after the sampling phase, the output reset switch 103, and the input reset switches 104p and 104m are cut off. Further, the switches 108 and 108m are cut off, and the terminals of the input capacitors 107p and 107m on the side of the switches 108p and 108m are short-circuited by a switch 109. Instead of applying a reference voltage Vref, the switch 105p connects a negative feedback capacitor 106p to the non-inverting output terminal of the operational amplifier 102. Similarly, instated of applying the reference voltage, the switch 105m connects the negative feedback capacitor 106m to the non-inverting output terminal of the operational amplifier 102.

The switches 105p, 105m, 108p, 108m and 109 are switched after cutting-off the input reset switches 104p and 104m. Therefore, a sum of charges are stored between the capacitor 106p and the capacitor 107p, and also a sum of charges are stored between the capacitor 106m and the capacitor 107m.

With this structure, an output voltage Vo(=Vop−Vom) of the switched capacitor amplifier circuit 101 is given by the following equation (1) in the hold face.

$$Vop - Vom = Cs/Cf \times (Vip - Vim) \tag{1}$$

In the equation (1), Cs indicates an electrostatic capacitor [F] of input capacitors 107p and 107m, and Cf indicates an electrostatic capacitor [F] of the negative input capacitors 106p and 106m.

However, the foregoing conventional structure has a problem in that when a larger gain is set, variations in amplification factor with variations in processes become more obvious.

Specifically, as is clear from the equation (1), the gain G of the conventional switched capacitor amplifier circuit 102 is given by Cs/Cf. Therefore, in the switched capacitor amplifier circuit 101, since the gain G is equal to the electrostatic capacitance ratio Cmax/Cmin(=Cs/Cf) between the capacitors 106 and 106m, and the capacitors 107p and 107m, the electrostatic capacitor ratio Cmax/Cmin becomes larger for the larger gain. As a result, for the larger gain, an area occupied by one capacitor becomes larger than an area occupied by the other capacitor, and it becomes more liable to be affected by variations in processes.

Furthermore, the feedback factor β is given by the following equation (2):

$$\begin{aligned}\beta &= Cf/(Cs + Cf) \\ &= 1/2 \times (1 - Cx/Ca)\end{aligned} \tag{2}$$

wherein Cs=Ca+Cx, and Cf=Ca−Cx.

Therefore, when setting a larger gain by setting a larger electrostatic capacitance ratio Cmax/Cmin, a feedback factor becomes smaller, which in turn reduces an operation speed of the switched capacitor amplifier circuit 101.

SUMMARY OF THE INVENTION

It is an object of the present invention to provide a switched capacitor amplifier which permits a reduction in capacitor ratio even when setting a laser gain.

In order to achieve the above object, a switched capacitor amplifier in accordance with the present invention is characterized by including:

a first capacitor having a first terminal and a second terminal, the first terminal being connected to a first connection point;

a second capacitor having a first terminal and a second terminal, the first terminal being connected to the first connection point; and control means which stores charges according to an input signal as input to each of the first capacitor and the second capacitor in a sampling phase, and varies a potential of the second terminal of the first capacitor and a potential of the second terminal of the second capacitor in opposite directions as a differential output while maintaining the charges at the first connection point.

Here, in the case where the second terminals of the first capacitor and the second capacitor vary in mutually opposite directions, the charges at the first connection point are maintained. Therefore, by the law of conservation of charge, the following equation holds:

$$Voa \cdot Ca + Vox \cdot Cx = Via \cdot Ca + Vix \cdot Cx \tag{3},$$

wherein Ca[F] and Cx[F] indicate the electrostatic capacitance of the first capacitor, and the electrostatic capacitance of the second capacitor respectively, Via, and Vix indicate respective potentials of the first capacitor and the second capacitor before being changed respectively, and Voa and Vox indicate the respective potentials of the second terminals of the first capacitor and the second capacitor after being changed respectively.

Here, Voa and Vox are differential outputs, and thus the following equation holds:

$$Vo = (Via \cdot Ca + Vix \cdot Cx - Vc \cdot (Ca+Cx))/(Ca-Cx) \quad (4)$$

wherein Voa=Vc+Vo, and Vox=Vc−Vo.

Here, for example, under the condition of Vc=0, Via=Vix=Vi, Vo=(Ca+Cx)/(Ca−Cx)·Vi, the gain becomes (Ca+Cx)/(Ca−Cx). Further, even in the case where Vix and Via are different, the gain is given by a function of values obtained by dividing Ca or Cx by (Ca−Cx). Therefore, by making the difference between the electrostatic capacitances of the capacitors smaller, it is possible to increase a gain of the switched capacitor amplifier.

As a result, unlike the conventional structure wherein the gain is determined by Cs/Cf, even in the case where a large gain of the switched capacitor amplifier is required to be set, it is not necessary to set the ratio of the electrostatic capacitances of the capacitors large. Therefore, a switched capacitor amplifier capable of controlling variations in gain can be realized without being affected by variations in the manufacturing processes.

Further, the control means changes respective potentials of the second terminals of the first capacitor and the second capacitor in mutually opposite directions, and therefore by supplying current as received from one side to the other side, it is possible to control the potential of each terminal with a smaller driving current as compared to the conventional structure wherein only the capacitor for forming the negative feedback current is provided between the input and output terminals of the operational amplifier, without the capacitor for forming the positive feedback capacitor. Therefore, provided that the power consumption is the same, a switched capacitor amplifier which permits higher speed operation can be realized.

It may be arranged such that in the sampling phase, the same voltage is applied to the respective second terminals of the first capacitor and the second capacitor. In this case, the condition of Via=Vix holds, and thus the gain of the switched capacitor amplifier can be set to (Ca+Cx)/(Ca−Cx).

The switched capacitor amplifier of the foregoing structure may be further arranged such that a plurality of input signals are provided, and a pair of the first capacitor and the second capacitor may be provided so as to correspond to the respective input signals. In this case, the switched capacitor amplifier can output a result of a product-sum operation of input signals.

Further, the switched capacitor amplifier having the foregoing structure may be further arranged such that:

a third capacitor, a terminal on one side of which being connected to the connection point, wherein in the hold phase, the control means changes a potential of the third capacitor according to an input signal different from input signals into the first capacitor and the second capacitor while maintaining charges at the first connection point.

According to the foregoing structure, before and after changes of each of the second terminals of the first capacitor and the second terminal changes, and before and after a potential of the third capacitor changes, charges at the first connection point are stored, and the switched capacitor amplifier can output a result of a product-sum operation of each of the input signals can be output as a differential output.

Further, in this case also, a gain is derived from a function obtained by driving each electrostatic capacitance value of the first through third capacitors by a difference between the first capacitor and the second capacitor, and a gain can be increased without increasing an electrostatic capacitance ratio.

In order to achieve the above object, another switched capacitor amplifier in accordance with the present invention is characterized by including:

a first capacitor having a first terminal and a second terminal, the first terminal being connected to an input terminal of an operational amplifier;

a second capacitor having a first terminal and a second terminal, the first terminal being connected to the input terminal of the operational amplifier;

a first switch which selects either an output terminal of the operational amplifier in an opposite polarity to the input terminal or a signal input terminal to which an input signal is input, and connects the terminal as selected to the second terminal of the first capacitor; and a second switch which selects either an output terminal of the operational amplifier in a same polarity to the input terminal or the signal input terminal, and connect the terminal as selected to the second terminal of the second capacitor.

According to the foregoing structure, in the state where the first switch or the second switch selects the signal input terminal, charges according to a difference between a voltage (input signal) of the signal input terminal and a voltage of the input terminal of the operational amplifier are stored in the first and second capacitors.

In this state, upon switching between the first switch and the second switch, the negative feedback circuit from the output terminal of the operational amplifier to the input terminal of the operational amplifier via the first capacitor and the positive feedback circuit from the output terminal in an opposite polarity to the output terminal to the input terminal of the operational amplifier are formed.

Here, in the transition from the state where the first switch and the second switch select the signal input terminal to the state where the positive and negative feedback circuits are formed, respective potentials of the terminals (second terminals) on the side of the first switch or the second switch of the first capacitor and the second capacitor vary in mutually opposite directions.

Therefore, the gain of the switched capacitor amplifier can be given by (Ca+Cx)/(Ca−Cx) wherein Ca and Cx indicate electrostatic capacitances of the first capacitor and the second capacitor, Vi indicates a voltage of the signal input terminal, and Vc−Vo and Vc+Vo indicate respective voltages of the output terminals of the operational amplifier.

As a result, unlike the conventional structure wherein the gain is determined by Cs/Cf, even in the case where a large gain of the switched capacitor amplifier is required to be set, it is not necessary to set the ratio of the electrostatic capacitances of the capacitors large. Therefore, a switched capacitor amplifier capable of controlling variations in gain can be realized without being affected by variations in the manufacturing processes.

The foregoing input signal is not necessarily be a differential signal but may be a signal transmitted according to one voltage level. In the case where the input signal is the differential signal, it is preferable be arranged such that:

a first input terminal to which one of differential input signals is input, and a second input terminal to which the other of the differential input signals is input are provided as the signal input terminal, and a pair of the first and second switches and the first and second capacitors are provided corresponding to a combination of a first input terminal as the signal input terminal and an inverting input terminal as an input terminal of the operational amplifier, and a combination of a second input terminal as the signal input terminal and a non-inverting input terminal as an input terminal of the operational amplifier.

According to the foregoing structure, two pairs of the first switch and the second switch, and the first capacitor and the second capacitor are provided. In this case, from the inverting output terminal of the operational amplifier, the negative feedback circuit to the non-inverting input terminal via the first capacitor, and the positive feedback circuit to the non-inverting input terminal via the second capacitor are formed. Similarly, from the non-inverting output terminal of the operational amplifier, both the negative feedback circuit to the inverting input terminal via the first capacitor and the positive feedback circuit to the non-inverting input terminal via the second capacitor are formed.

Therefore, the feedback factor of the operational amplifier is given by $(Ca-Cx)/(Ca+Cx)$. As a result, as compared to the conventional structure wherein the gain is determined by $Cs/Cf$, and a feedback factor is $½×(1-Cx/Ca)$ wherein $Cs=Ca+Cx$ and $Cf=Ca-Cx$ indicate feedback factors respectively, it is possible to increase the feedback factor with respect to the same gain. As a result, a switched capacitor amplifier which permits a high speed operation can be realized.

The switched capacitor amplifier of the foregoing structure may be further arranged such that the input signal terminals are provided corresponding to a plurality of input signals respectively, and pairs of the switches and the capacitors are provided corresponding to the respective signal input terminals.

Further, the switched capacitor amplifier of the foregoing structure may be further arranged such that:

a third capacitor having a first terminal connected to an input terminal of the operational amplifier; and a third switch which switches between I) a signal input terminal, to which an input signal different from an input signal, is to be input, is connected to the second terminal of the third capacitor and II) a predetermined reference potential is applied to the second terminal of the third capacitor.

In the foregoing structure, the charges at the first connection point are stored before and after switching the first through third switches, and thus the switched capacitor amplifier can output a result of product-sum operation of respective input signals as the differential output.

In this case also, the gain is a sum of the values obtained by dividing each of the electrostatic capacitance values of the first through third capacitors by a difference between the first capacitor and the second capacitor, and a gain can be increased without increasing an electrostatic capacitance ratio. As a result, a switched capacitor amplifier which can suppress variations in gain can be realized without being affected by variations in manufacturing processes.

The switched capacitor amplifier of the foregoing structure may be arranged such that at least one of the first capacitor and the second capacitor is a variable capacitance capacitor. Further, it may be further arranged such that at least either the first capacitor or the second capacitor is a capacitor array, and either the first capacitor or the second capacitor is a capacitor array, and the capacitor array includes a plurality of capacitors, and a switch for changing an electrostatic capacitor value of the capacitor array by switching each of the capacitors.

According to the foregoing structure, at least either the first capacitor or the second capacitor changes an electrostatic capacitor value. As a result, a switched capacitor amplifier capable of adjusting a gain can be realized.

Further, the foregoing structure wherein the same voltage is applied to the respective second terminals of the first capacitor and the second capacitor in the sampling phase, or the structure provided with the first switch and the second switch, may be further arranged such that at least either one of the first capacitor and the second capacitor may be a capacitor capable of changing the electrostatic capacitor values linearly with respect to the control signals.

According to the foregoing structure, the gain is given by $(Ca+Cx)/(Ca-Cx)$, and at least one of the first capacitor and the second capacitor is capable of changing the electrostatic capacitor values linearly, and thus a switched capacitor amplifier of a decibel-linear variable gain can be realized.

In order to achieve the above object, an analog interface circuit for the charge coupled element of the present invention is arranged so as to include a correlated double sampling circuit for carrying out a correlated double sampling with respect to an analog signal as input from a charge coupled element;

an amplifier circuit for amplifying an output signal from the correlated double sampling circuit;

an analog-digital converter for outputting an output from the amplifier circuit into a digital signal; and a digital-analog converter for compensating the output signal from the analog-digital converter with a black level compensating signal, and converting the output signal as compensated into an analog signal, and feeding back the resulting signal into an input of the amplifier circuit, wherein the amplifier circuit is a switched capacitor amplifier which includes:

an analog interface circuit for a charge-coupled element, comprising:

a correlated double sampling circuit for carrying out a correlated double sampling with respect to an analog signal as input from a charge coupled element;

an amplifier circuit for amplifying an output signal from the correlated double sampling circuit;

an analog-digital converter for outputting an output from the amplifier circuit into a digital signal; and a digital-analog converter for compensating the output signal from the analog-digital converter with a black level compensating signal, and converting the output signal as compensated into an analog signal, and feeding back the resulting signal into an input of the amplifier circuit, wherein the amplifier circuit is a switched capacitor amplifier which includes:

a first capacitor having a first terminal and a second terminal, the first terminal being connected to a first connection point;

a second capacitor having a first terminal and a second terminal, the first terminal being connected to the first connection point; and control means which stores charges according to an input signal as input to each of the first capacitor and the second capacitor in a sampling phase, and varies a potential of the second terminal of the first capacitor and a potential of the second terminal of the second capacitor in opposite directions as a differential output while maintaining the charges at the first connection points.

In order to achieve the above object, another analog interface circuit for the charge coupled element of the present invention is arranged so as to include a correlated double sampling circuit for carrying out a correlated double sampling with respect to an analog signal as input from a charge coupled element;

an amplifier circuit for amplifying an output signal from the correlated double sampling circuit;

an analog-digital converter for outputting an output from the amplifier circuit into a digital signal; and a digital-analog converter for compensating the output signal from the analog-digital converter with a black level compensating signal, and converting the output signal as compensated into an analog signal, and feeding back the resulting signal into an input of the amplifier circuit, wherein the amplifier circuit is a switched capacitor amplifier which includes:

an analog interface circuit for a charge-coupled element, comprising:

a correlated double sampling circuit for carrying out a correlated double sampling with respect to an analog signal as input from a charge coupled element;

an amplifier circuit for amplifying an output signal from the correlated double sampling circuit;

an analog-digital converter for outputting an output from the amplifier circuit into a digital signal; and a digital-analog converter for compensating the output signal from the analog-digital converter with a black level compensating signal, and converting the output signal as compensated into an analog signal, and feeding back the resulting signal into an input of the amplifier circuit, wherein the amplifier circuit is a switched capacitor amplifier which includes:

a first capacitor having a first terminal and a second terminal, the first terminal being connected to an input terminal of an operational amplifier;

a second capacitor having a first terminal and a second terminal, the first terminal being connected to the input terminal of the operational amplifier;

a first switch which selects either an output terminal of the operational amplifier in an opposite polarity to the input terminal or a signal input terminal to which an input signal is input, and connects the terminal as selected to the second terminal of the first capacitor; and a second switch which selects either an output terminal of the operational amplifier in a same polarity to the input terminal or the signal input terminal, and connect the terminal as selected to the second terminal of the second capacitor.

According to the foregoing structure, by the correlated double sampling circuit, a low frequency noise of an analog signal as input from the charge-coupled element is removed. Further, after being amplified by the amplifying circuit, the output of the correlated double sampling circuit is converted into a digital value, and the resulting digital signal is output. The resulting digital signal is compensated with the black level compensating signal, and is converted into an analog signal, and is fed back to the input of the amplifying circuit. As a result, since the amplifying circuit improves a gain without increasing an electrostatic capacitance ratio, variations in gain due to variations in manufacturing processes can be suppressed. As a result, an analog interface circuit for a charge coupled element capable of outputting a high precision digital signal can be realized even when setting a large gain, without increasing an electrostatic capacitance ratio.

For a fuller understanding of the nature and advantages of the invention, reference should be made to the ensuing detailed description taken in conjunction with the accompanying drawings.

DESCRIPTION OF THE EMBODIMENTS

Embodiment 1

Figure 1:
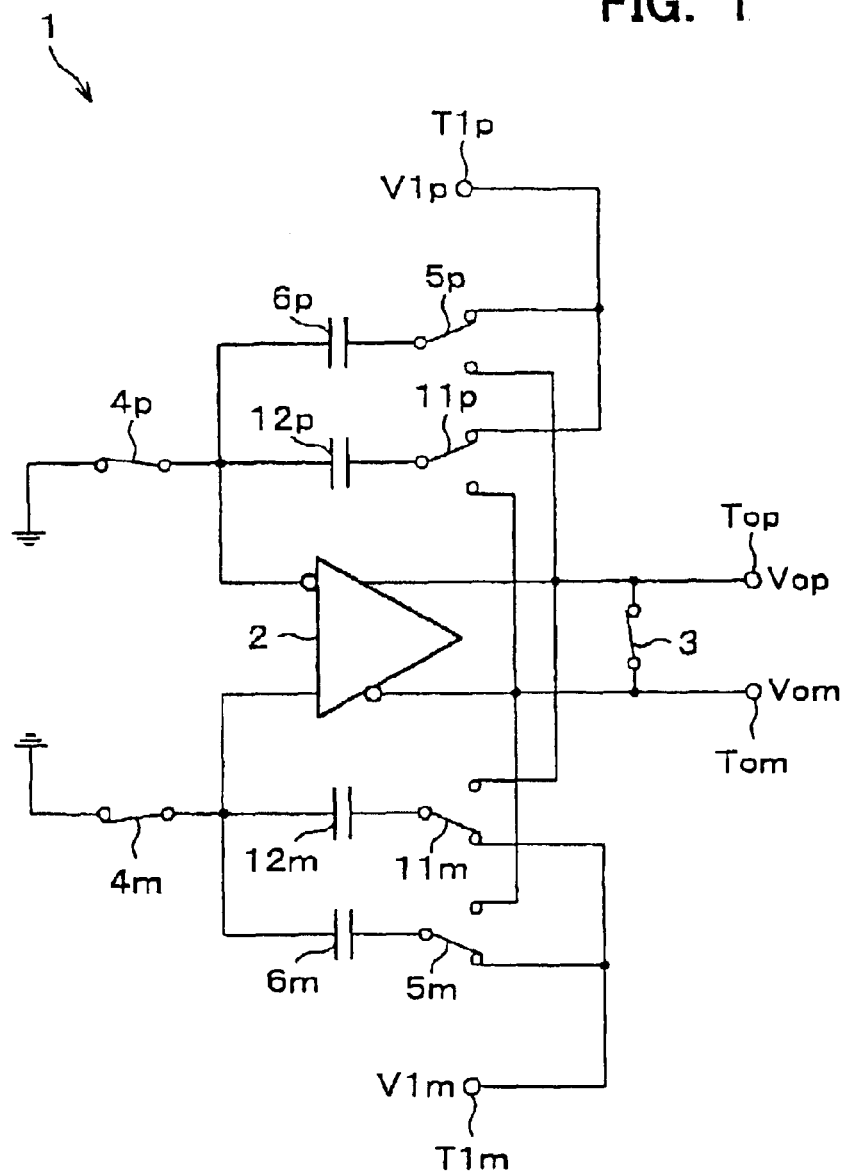
FIG. 1 is a circuit diagram illustrating the structure of essential parts of a switched capacitor amplifier in accordance with one embodiment of the present invention.

The following descriptions will explain one embodiment of the present invention in reference to FIG. 1.

A switched capacitor amplifier circuit (switched capacitor amplifier) 1 in accordance with the present invention is arranged so as to amplify with a predetermined gain, a differential input signal V1(=V1p−V1m) as input to differential input terminals T1p and T1m serving as signal input terminals, and output the resulting signal as amplified as a differential output signal Vo(=Vop−Vom) from differential output terminals Top and Tom. The switched capacitor amplifier circuit 1 in accordance with the present embodiment is suitably applied, for example, to an analog interface of a CCD image sensor which is required to operate at high speed while suppressing adverse effects from variations in processes.

The switched capacitor amplifier circuit 1 increases an operational amplifier 2 for differential input and output. The reversing output terminal and the non-inverting output terminal of the operational amplifier 2 are connected to the differential output terminals Top and Tom respectively, and an output reset switch 3 is provided in between. To the inverting output terminal and the non-inverting output terminal of the operational amplifier 2, a predetermined reference potential can be applied respectively via input reset switches 4p and 4m. In the example of FIG. 1, the reference potential is in the ground level, and the terminals on one end of the input reset switches 4p and 4m are connected to ground respectively.

The non-inverting output terminal of the operational amplifier 2 is connected to an inverting input terminal of the operational amplifier 2 via a negative feedback switch 5p and a negative feedback capacitor 6p for forming a negative feedback circuit. The negative feedback switch 5p is a switch for 2-input-1-output, and is capable of selectively connecting either the differential input terminal (first input terminal) T1p or the non-inverting output terminal of the operational amplifier 2 to the terminal on the side of the negative feedback switch 5p of the negative feedback capacitor 6p. Similarly, the inverting output terminal of the operational amplifier 2 is connected to the non-inverting input terminal of the operational amplifier 2 via the negative feedback switch 5m and the negative feedback capacitor 6m. The negative feedback switch 5m is a switch for 2-input-1-output, and is capable of selectively connecting either the differential input terminal (second input terminal) T1m or the inverting output terminal of the operational amplifier 2 to the negative feedback capacitor 6m.

Further, the switched capacitor amplifier circuit 1 in accordance with the present embodiment is provided with positive feedback switches 11p and 11m and positive feedback capacitors 12p and 12m for forming a positive feedback circuit.

Specifically, the inverting output terminal of the operational amplifier 2 is connected to the inverting input terminal of the operational amplifier 2 via the positive feedback switch 11p and the positive feedback capacitor 12p. The positive feedback switch 11p is also a 2-input-1-output switch, and is capable of selectively connecting either the differential input terminal T1p or the inverting output terminal to the terminal on the side of the positive feedback switch 11p of the positive feedback capacitor 12p. Similarly, the non-inverting output terminal of the operational amplifier 2 is connected to the non-inverting input terminal of the operational amplifier 2 via the positive feedback switch 11m and the positive feedback capacitor 12m. The positive feedback switch 11m is capable of selectively connecting either the differential input terminal T1m or the non-inverting output terminal to the positive negative feedback capacitor 12m.

In the present embodiment, the negative feedback switches 5p and 5m correspond to the first switch as claimed, and the negative feedback capacitors 6p and 6m correspond to the first capacitor as claimed. Similarly, the positive feedback switches 11p and 11m correspond to the second switch as claimed, and the positive feedback capacitors 12p and 12m correspond to the second switch as claimed. Further, the operational amplifier 2 and each of the foregoing switches correspond to the control means as claimed.

According to the foregoing structure, in the sampling phase for sampling the differential input signal V1, the input reset switches 4p and 4m conduct. As a result, charges as stored in nodes of the inverting input terminal and non-inverting input terminal of the operational amplifier 2 are released, and the inverting input terminal and the non-inverting input terminal are reset to a predetermined reference voltage (ground level in the example of FIG. 1). Similarly, in the interface, by conducting the output reset switch 3, the non-inverting output terminal and the inverting output terminal of the operational amplifier 2 are short-circuited, and are reset to the differential output voltage Vo(=Vop−Vom).

Further, in the sampling phase, the members on the inverting input side, i.e., the negative feedback and positive feedback switches 5p and 11p select the differential input terminal T1p, and the members on the non-inverting input side, i.e., the negative feedback and positive feedback switches 5m and 11p select the differential input terminal T1m. Here, in the sampling phase, the terminals on one side of the capacitors 6p and 12p are maintained at the reference voltage by conducting the input reset switch 4p. Therefore, in each of the capacitors 6p and 12p, charges corresponding to the differential input voltage V1p are stored. Similarly, the terminals on one side of the capacitors 6m and 12m are maintained at the reference voltage. Therefore, in each of the capacitors 6m and 12m, charges corresponding to the differential input voltage V1m are stored. FIG. 1 describes the state of each switch in the sampling face.

On the other hand, in the hold face for amplifying an input signal, the input reset switches 4p and 4m are cut off. As a result, charges in the node of the inverting input terminal and the charges in the node of the non-inverting terminal of the operational amplifier 2 are stored respectively. In this state, as the input reset switch 4p is cut off, a sum of charges is stored between the negative feedback capacitor 6p and the positive feedback capacitor 12p. Similarly, as the input reset switch 4m is cut off, a sum of the charges is stored between the negative feedback capacitor 6m and the positive feedback capacitor 12m.

Furthermore, in the hold phase, in the state where the input reset switches 4p and 4m are cut off, the output reset switch 3 is cut off, and the negative feedback switches 5p and 5m and the positive feedback switches 11p and 11m are switched.

Specifically, the negative feedback switch 5p is connected to the non-inverting output terminal of the operational amplifier 2, and the negative feedback switch 5m is connected to the inverting output terminal of the operational amplifier 2. As a result, the negative feedback capacitors 6p and 6m can apply negative feedback to the operational amplifier 2.

On the other hand, by switching, the positive feedback switch 11p is connected to the inverting output terminal of the operational amplifier 2, and the positive feedback switch 11m is connected to the non-inverting output terminal of the operational amplifier 2. As a result, the positive feedback capacitors 12p and 12m can apply positive feedback to the operational amplifier 2.

By cutting off the input reset switch 4p, charges in the node of the inverting input terminal of the operational amplifier 2 are stored before and after switching the negative feedback and positive feedback switches 5p and 11p. Similarly, by cutting off the input reset switch 4m, charges in the node of the non-inverting input terminal of the operational amplifier 2 are stored before and after switching the negative and positive feedback switches 5m and 11m.

Therefore, the electrostatic capacitance of the negative feedback capacitors 6p and 6m is given by the following equation (5):

$$Vop - Vom = (Ca + Cx)/(Ca - Cx) \cdot (V1p - V1m) \quad (5)$$
$$= (1 + x)/(1 - x) \cdot (V1p - V1m).$$

wherein the electrostatic capacitor of the negative feedback capacitors 6p and 6m are Ca[F], and the electrostatic capacitor of the positive feedback capacitors 12p and 12m are Cx=Ca·x[F] respectively.

The gain G of the switched capacitor amplifier circuit 1 is given by following equation (6):

$$G = (1+x)/(1-x) \quad (6)$$

In the switched capacitor amplifier circuit 1 in accordance with the present embodiment, the condition of Ca>Cx holds, and the electrostatic capacitor ratio Cmax/Cmin (maximum electrostatic capacitor/minimum electrostatic capacitor) in the switched capacitor amplifier circuit 1 is given by the following formula (7):

$$Cmax/Cmin = Ca/Cx \quad (7)$$
$$= (G+1)/(G-1).$$

Therefore, unlike the structure of the conventional switched capacitor amplifier circuit 101, i.e., the structure with the electrostatic capacitor ratio of Cmax/Cmin=Cs/Cf=G, an increase in the electrostatic capacitor ratio Cmax/Cmin can be avoided, even for the larger gain G.

Therefore, even when a large gain G is required, variations in gain G with variations in processes do not generate, and it is therefore possible to ensure a high precision arithmetic operation of the switched capacitor amplifier circuit 1.

Furthermore, even in the case where a large gain G is needed, the electrostatic capacitor ratio Cmax/Cmin is not increased, thereby realizing a compact layout. Furthermore, in the conventional switched capacitor amplifier circuit 1, a sum of respective electrostatic capacitor values of each capacitor is given by 2·(Cs+Cf, and becomes 4·Ca under the conditions of Cs=Ca+Cx, and Cf=Ca−Cx. On the other hand, according to the switched capacitor amplifier circuit 1 in accordance with the present embodiment, a sum of electrostatic capacitor values of the respective capacitors is given by 2·(Ca+Cx). Therefore, as in the present embodiment, under the condition of 0≦x<1, the switched capacitor amplifier circuit 1 provides a smaller electrostatic capacitor value required for the circuit as compared to the conventional switched capacitor amplifier circuit 101. As a result, in the integrated circuit, the switched capacitor amplifier circuit 1 of a smaller circuit area can be realized.

Furthermore, the feedback factor β of the switched capacitor amplifier circuit 1 is given by the following equation (8):

$$\beta = (1-x)/(1+x) \tag{8}$$

In the switched capacitor amplifier circuit 1 in accordance with the present embodiment, the condition of Ca>Cx, i.e., 0≦x<1 holds.

Therefore, as compared to the structure of the conventional switched capacitor amplifier circuit 101 wherein the gain is determined based on Cs/Cf, and the feedback factor is given by ½×(1−Cx/Ca) when the conditions of Cs=Ca+Cx, and Cf=Ca−Cx hold, the switched capacitor amplifier circuit 1 in accordance with the present embodiment provides a larger feedback factor β with respect to the same gain, and it is therefore possible to ensure a high speed operation.

On the other hand, according to the conventional switched capacitor amplifier circuit 101, the noise (kTC noise) Vα appeared in the output voltage (Vop−Vom) by the input resent switches 104p and 104m is given by the following equation (9):

$$V\alpha^2 = 2\times(2 \cdot Ca \cdot k \cdot T)/(Ca-Cx)^2 \tag{9}$$

under the conditions of Cs=Ca+Cx, and Cf=Ca−Cx.

In contrast, according to the switched capacitor amplifier 1 in accordance with the present embodiment, noise Vα appeared in the output voltage (Vop−Vom) by the input resent switches 4p and m is given by the following equation (10):

$$V\alpha^2 = 2 \cdot (Vop\Lambda Vom)(Ca+Cx) \cdot k \cdot T/(Ca-Cx)^2 \tag{10}$$

In the equations (9) and (10), k indicates a Boltzmann constant, and T indicates an absolute temperature. In each of the equations (9) and (10), "2·" on the right hand side indicates the effects from the two switches (104p, 104m, or 4p and 4m).

As a result, the kTC noise of the switched capacitor amplifier circuit 1 can be made smaller than that in the conventional switched capacitor amplifier circuit 101 with respect to substantially the same gain. Therefore, a switched capacitor amplifier circuit 1 with substantially the same kTC noise level can be realized by adopting a smaller electrostatic capacitor than that adopted in the conventional switched capacitor amplifier circuit 101.

EMBODIMENT 2

Figure 2:
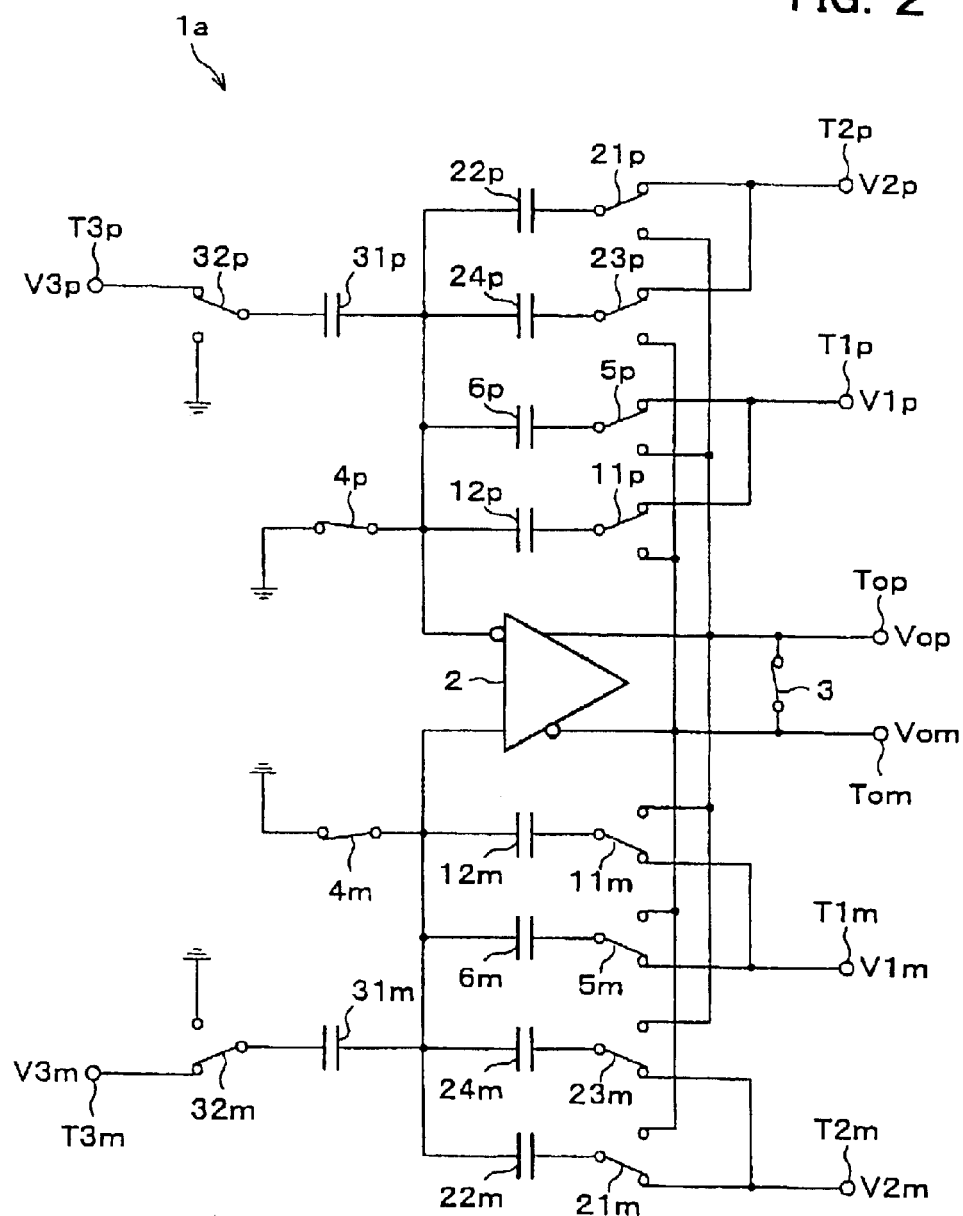
FIG. 2 is a circuit diagram illustrating the structure of essential parts of a switched capacitor amplifier in accordance with another embodiment of the present invention.

The following descriptions will explain another embodiment of the present invention in reference to FIG. 2.

In the first embodiment, explanations have been give through the case of the switched capacitor amplifier circuit 1 for amplifying a pair of differential input signals V1(=V1p−V1m). In the present embodiment, explanations have been given through the case where a product-sum operation is performed with respect to the plural pairs (three pairs, for example) of differential input signals V1 to V3 referring to FIG. 2.

In the switched capacitor amplifier circuit 1a in accordance with the present embodiment, in addition to the structure of the switched capacitor amplifier circuit 1 shown in FIG. 1, members 21p, 22p, 23p, 24p, 21m, 22m, 23m, and 24m which are connected in the same manner as the members 5p, 6p, 11p, 12p, 5m, 6m, 11m, and 12m shown in FIG. 1. It should be noted here that these members are provided for adding and amplifying the differential input signal V2, and thus the negative feedback and positive feedback switches 21p and 23p are not connected to the differential input terminal T1p but connected to the differential input terminal T2p. The negative feedback and positive feedback switches 21m and 23m are not connected to the differential input terminal T1m but connected to the differential input terminal T2m.

The switched capacitor amplifier circuit 1a is provided with input capacitors (third input capacitor) 31p and 31m and input switches (third switch) 32p and 32m for adding and amplifying a differential input signal V3(=V3p−V3m) as input to the differential input terminals T3p and T3m.

The input switch 32p is a 2-input-1-output switch, which is capable of selectively applying a differential input voltage V3p from the differential input terminal T3p or a predetermined reference voltage (ground level in an Example of FIG. 2) to one of the terminals of the input capacitor 31p. Similarly, the other terminal of the input capacitor 31p is connected to the inverting input terminal of the operational amplifier 2. Similarly, the input switch 32m selectively inputs either the differential input voltage V3m or the reference voltage to one of the terminals of the input capacitor 31m, and the other terminal of the input capacitor 31m is connected to the non-inverting input terminal of the operational amplifier 2. Here, in FIG. 2, the state of the switches in the sampling phase is omitted as in FIG. 1.

According to the foregoing structure of FIG. 2, in the sampling phase, the differential output voltage Vo(=Vop−Vom) is reset by conducting the output reset switch 3 and the input reset switches 4p and 4m, and the inverting input terminal and the non-inverting input terminal of the operational amplifier 2 are reset to a predetermined voltage (ground level in the Example of FIG. 2) as in the case of the switched capacitor amplifier circuit 1 shown in FIG. 1.

As in the same manner as the switched capacitor amplifier circuit 1, each of the switches 5p, 5m, 11p, 11m, 21p, 21m, 23p and 23m selects the corresponding side of the input terminal T1p, T1m, T2p or T2m. As a result, in the negative feedback and positive feedback capacitors 6p and 12p, stored are charges corresponding to the differential input voltage V1p, and charges according to the differential input voltage V1m are stored in the negative feedback and positive feedback capacitors 6m and 12m. In the negative feedback and positive feedback capacitors 22p and 24p, charges according to the differential input voltage are stored, and charges according to the differential input voltage V2m are stored in the negative feedback and positive feedback capacitors 22m and 24m.

Further, in the sampling phase, input switches 32p and 32m select a corresponding input terminal, i.e., either input terminal T3p or an input terminal T3m. As a result, in the input capacitor 31p, stored are charges corresponding to the differential input voltage V3p, and in the input capacitor 31m, charges corresponding to the differential input voltage V3m are stored.

In the hold phase after the sampling phase, the input reset switches 4p and 4m are cut off, and the charges in the inverting input terminal and the non-inverting input terminal of the operational amplifier 2 are stored. In this state, a sum of the charges is stored in the capacitors 6p, 12p, 22p, 24p and 31p, and a sum of the charges is stored also in the capacitors 6m, 12m, 22, 24m, and 31m.

Further, in the state where the input reset switches 4p and 4m are cut off, upon cutting off the output reset switch 3, each of the switches 5p, 11p, 21p, 23p, 32p, 5m, 11m, 21m, 23m, 32m are switched. Here, when switching each switch, charges of the inverting input terminal and the non-inverting input terminal of the operational amplifier 2 are stored respectively, and thus the differential output voltage Vo(Vop−Vom) when switching is given by the following equation (11):

$$Vop - Vom = (Ca1 + Cx1)/(Ca1 + Ca2 - Cx1 - Cx2) \cdot \quad (11)$$
$$(V1p - V1m) + (Ca2 + Cx2)/$$
$$(Ca1 + Ca2 - Cx1 - Cx2) \cdot (V2p - V2m) +$$
$$Cs/(Ca1 + Ca2 - Cx1 - Cx2) \cdot (V3p - V3m)$$
$$= G1 \cdot V1 + G2 \cdot V2 + G3 \cdot V3.$$

In the formula (11), Ca1[F] indicates an electrostatic capacitor of negative feedback capacitors 6p and 6m, and Cx1[F] indicates an electrostatic capacitor of positive feedback capacitors 12p and 12m, Ca2[F] indicates an electrostatic capacitor of negative feedback capacitors 22p and 22m, Cx2[F] indicates an electrostatic capacitor of positive feedback capacitors 24p and 24m, and a Cs[F] is an electrostatic capacitor of the input capacitors 31p and 31m.

As a result, it is possible to provide a switched capacitor amplifier circuit 1a capable of adding and amplifying plural paris of (for, example, three pairs) of differential input signals V1 to V3.

In this above case also, not only the negative feedback capacitors 6p, 6m, 22p and 22m, but also positive feedback capacitors 12p, 12m, 24p, 24m are provided, and therefore, in the equation (11), the denominator of the gains G1 to G3 is (Ca1+Ca2−Cx1−Cx2). Therefore, in the conventional switched capacitor amplifier circuit 101 wherein the input capacitors 107p and 107m are provided in plural pairs corresponding to the differential input signals V1 to V3, the switched capacitor amplifier circuit 1a can suppress the electrostatic capacitor ratio Cmax/Cmin despite that the gains G1 to G3 are the same as those of the switched capacitor amplifier circuit 101.

Therefore, in the same manner as the first embodiment, the feedback factor β of the switched capacitor amplifier circuit 1a can be increased, and a kTC noise can be reduced.

In the foregoing preferred embodiment, explanations have been given through the case of three pairs of differential input signals, the number of the pairs of the differential input signals is not particularly limited. Namely, by increasing or reducing the number of either the members 21p to 24p, 21m to 24m, or the members 31p, 32p, 31m and 32m according to an increase or decrease in the number of the differential input signals, the same effect as achieved from the structure of the present embodiment can be ensured.

EMBODIMENT 3

Figure 3:
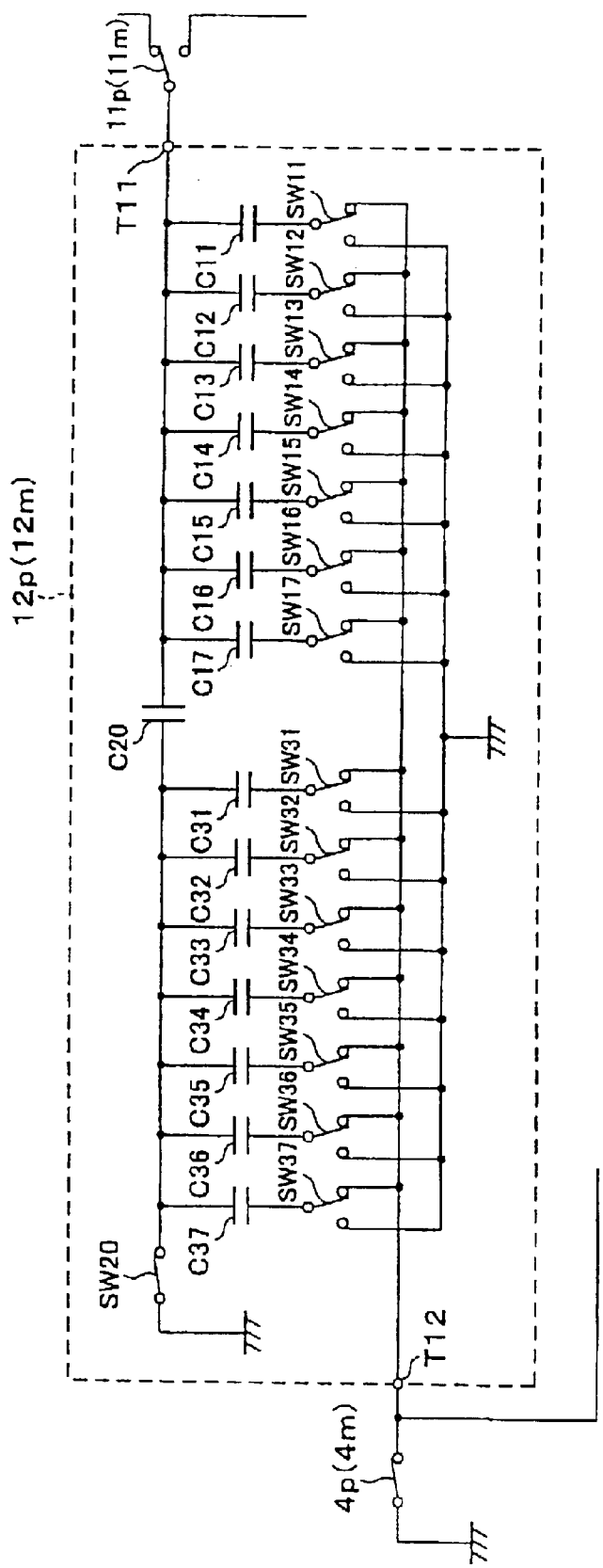
FIG. 3 is a circuit diagram illustrating a positive feedback capacitor of a switched capacitor amplifier in accordance with still another embodiment of the present invention.

The following descriptions will explain another embodiment of the present invention in reference to FIG. 3.

In the foregoing preferred embodiments, explanations have been given through the case of adopting a single capacitor for each of the capacitors 6p, 6m, 12p, 12m, 22p, 22m, 24p, 24m, 31p and 31m. However, the present invention is not limited to this structure, and may be realized by a plurality of capacitors connected in parallel or series, or by further connecting these plurality of capacitors connected in parallel or series a plurality of capacitors connected in parallel or series. In the foregoing preferred embodiment, explanations have been given through the case where each capacitor 6p has a fixed electrostatic capacitor value. However, the present invention is not limited to the above arrangement, and the structure with a variable electrostatic capacitor value may be adopted, and such structure may be realized by adopting a capacitor with a variable electrostatic capacitor value for each capacitor 6p, by switching a connection between the plurality of capacitors by realizing the plurality of capacitors.

In the following, explanations will be given through a switched capacitor radder which can maintain an electrostatic capacitor value to be constant in view of differential input terminals T1p, T1m, irrespectively of an electrostatic capacitor value in view of input and output terminal of the operational amplifier 2 as a preferred structure for variable electrostatic capacitor value. The capacitor array of the present embodiment can be applied to either of the capacitors 6p of the switched amplifier circuits 1 and 1a. In the following example, the capacitor array is adopted as positive feedback capacitors 12p and 12m of the switched capacitor amplifier circuit 1.

Namely, as shown in FIG. 3, the positive feedback capacitor 12p in accordance with the present embodiment includes a plurality of capacitors C11 to C17 (seven in the example), wherein a terminal on one side (first terminal) of each capacitor is connected to a terminal T11 on the side of the positive feedback switch 11p. The other terminal (second terminal) of each capacitor C11 to C17 is connected to a terminal T12 on the side of the input reset switch 4p via corresponding switch (switches SW11 to SW17). Each of the switches SW11 to SW17 is an 1-input-2-output switch, and is capable of selecting either connecting the terminal T12 to the second terminal of corresponding capacitor C11 to C17, or applying a predetermined reference voltage (ground level in the Example) to the second terminal. Here, the reference voltage is the same as the reference voltage applied to the input-reset switch 4p.

The positive feedback capacitor 12p is also provided with the capacitor C20 and the switch SW20. One of the terminals of the capacitor C20 is connected to the terminal T11, and to the other terminal, a predetermined reference voltage (ground level in the example of FIG. 3) can be applied via the switch 20.

To the terminal of the capacitor C20 on the side of the switch SW20, connected are capacitors C31 to C37 and switches SW31 to SW37 which are connected in the same manner as the capacitors C11 to C17 and the switches SW31 to S37, respectively. On this side, the first terminal of each of the capacitors 31 to C37 is not connected to the terminal T11 but connected to the terminal on the side of the switch SW20 of the capacitor C20.

Further, in the present embodiment, like the positive feedback capacitor 12p, the positive feedback capacitor 12m is constituted by a switched capacitor raddar provided with capacitors C11 and C37 and switches SW11 to SW37.

In FIG. 3, as in FIGS. 1 and 2, switches SW20, 4p, and 11p show the state of the sampling phase. Incidentally, the switches SW11 to SW37 are switched according to an electrostatic capacitor value to be set for the positive feedback capacitor 12p (12m). FIG. 3 shows the state where the electrostatic capacitance value is set to be a maximum value, i.e., each of the switches SW11 to SW37 selects all the terminals T12.

In the above arrangement, the switch SW20 is conducted in the sampling phase, and the node on the side of the switch SW20 of the capacitor C20 is reset. Further, the switch SW20 is arranged so as to store charges in the node on the side of the switch SW20 of the capacitor C20.

Here, in the sampling phase, the input reset switch 4p (4m) is conducted, and the positive feedback switch 11p (11p) selects the differential input terminal T1p (T1m). Therefore, irrespectively of the terminal selected by the switches SW11 to SW37, the second terminal (terminal on the side of the switch) of the corresponding capacitor (capacitors C11 to C37) is maintained at the same reference voltage. As a result, irrespectively of the set value for the electrostatic capacitor value of the positive feedback switch 11p (11m), an electrostatic capacitor value when seen from the differential input terminal T1p (T1m) remain unchanged. Therefore, the required driving ability for the driver circuit for driving the differential input signal V1 provided in the former stage of the driver circuit, i.e., the switched capacitor amplifier circuit 1 is not changed without being affected by eth electrostatic capacitor value, and an optimal driver circuit is liable to be achieved.

On the other hand, in the hold phase after the sampling phase, the input reset switches 4p and 4m are cut off, and between the positive feedback capacitor 12p and the negative feedback capacitor 6p, charges are moved so that the sum of the respective charges remains unchanged. Similarly, charges are moved between the negative feedback capacitor 12m and the negative feedback capacitor 6m, so that the sum of the respective charges remains unchanged.

However, according to the positive feedback capacitor 12p (12m) of the foregoing structure, among the capacitors C11 to C17 and C31 to C37, those corresponding to the switches which select the reference voltage are not connected to the terminal T12, and thus charges are not moved.

As a result, in the hold phase, the electrostatic capacitor value C between the terminals T11 and T12 changes in a range of 0 to 63/8×C1[F] by switching each of the switches SW11 to SW17 and the switches SW31 and SW37 with the electrostatic capacitor value of the capacitors C20 and C31 to C37 of D1[F] in the C1/8[F] step. Specifically, in the case of the present embodiment, the electrostatic value C increases by C1[F] each time when switching the switches SW1 to SW17, and increases by C1/8[F] each time when switching the switches SW31 to SW37 to the side of the terminal T12.

As described, according to the foregoing structure, by switching each of the switches SW11 to SW17 and SW31 to SW37, the electrostatic capacitor value C of the positive feedback capacitors 12p and 12m changes linearly.

Here, the gain G of the switched capacitor amplifier circuit 1 is (1+x)/(1−x) as shown in the equation (5), the gain G can be expressed by the following formula (12).

$$G=(1+x)/(1-x) \approx \exp(2 \cdot x) \quad (12)$$

Therefore, the gain G can be changed exponentially by changing x(−Cx/Ca) linearly by changing the electrostatic capacitor value C of the positive feedback capacitors 12p and 12m linearly. As a result, the switched capacitor amplifier circuit 1 which permits a digital gain in a linear from can be realized.

For example, according to the foregoing structure, in the case where the electrostatic capacitor Ca of the negative feedback capacitor 6p (5m) is set to 24×C1, the ratio x(=Cx/Ca) changes in a range of from 0 to 6 dB, and the 6/64 dB step and 6 bit gain can be set approximately.

EMBODIMENT 4

Figure 4:
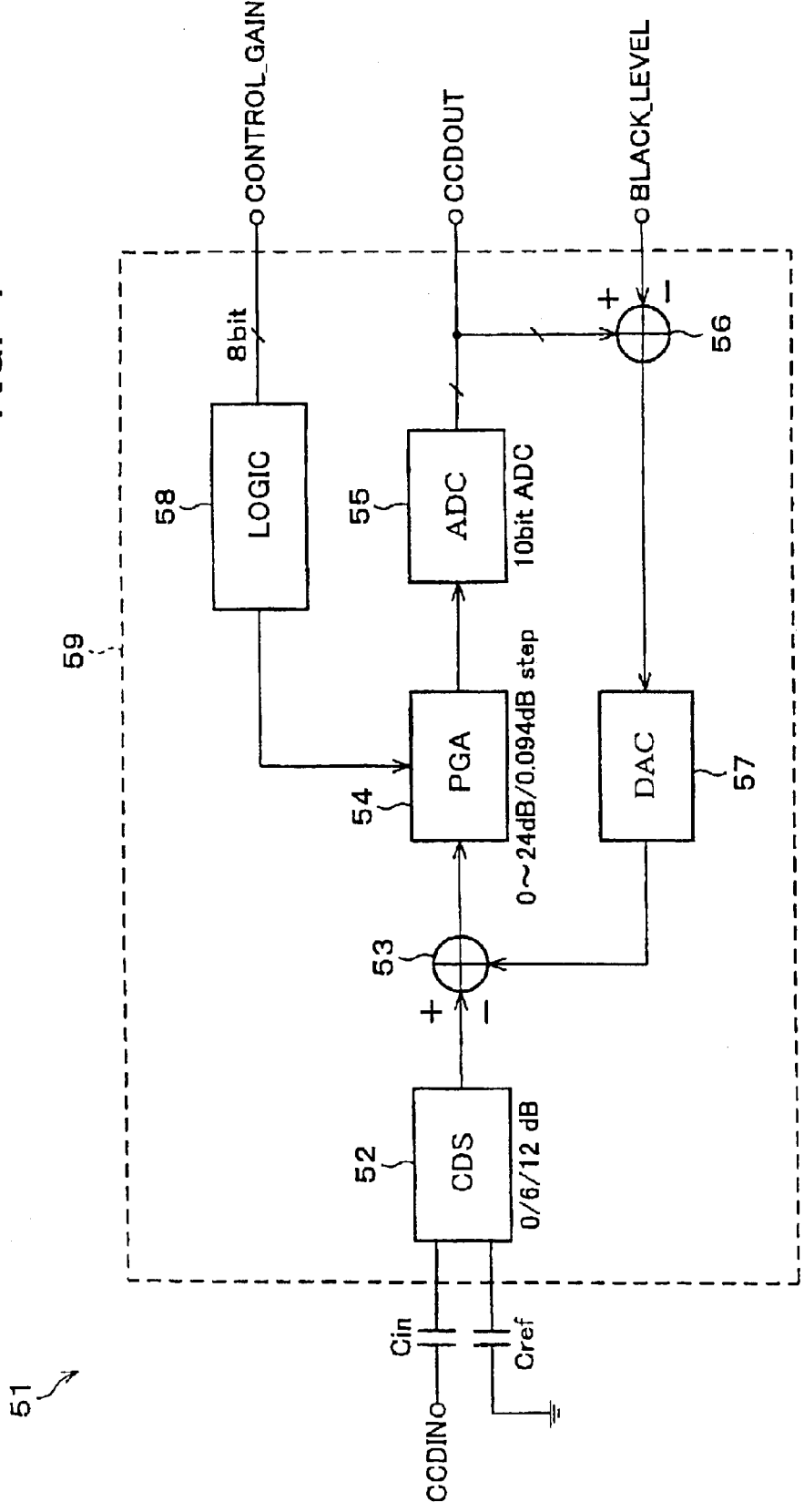
FIG. 4 is a block diagram illustrating essential parts of an analog interface of a CCD image sensor in accordance with still another embodiment of the present invention.
Figure 5:
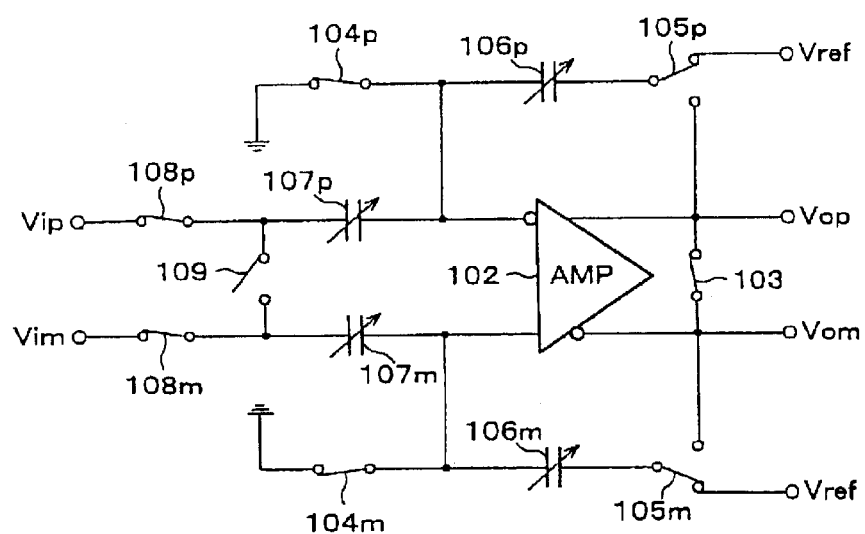
FIG. 5 is a circuit diagram illustrating essential parts of a conventional switched capacitor amplifier.

The following descriptions will explain another embodiment of the present invention in reference to FIG. 4.

In the present embodiment, referring to FIG. 4, explanations will be given through the case where the switched capacitor amplifier circuit 1(1a) in accordance with the third embodiment is applied to an analog interface (charge coupled element analog interface circuit) 51 of a CCD image sensor referring to FIG. 4.

Namely, the analog interface 51 in accordance with the present embodiment performs such process as removing a low frequency noise level or amending a black level with respect to an analog CCD image signal as input to the input terminal CCDIN, and outputs a digital signal as processed from an output terminal CCDOUT. To the input terminal CCDIN, a CCD sensor (not shown) is connected, and to the output terminal CCDOUT, a digital circuit (not shown) is connected.

The analog interface 51 includes a correlated double sampling circuit (CDS circuit) 52, a subtracter 53, a PGA (Programable Gain Amp) circuit 54, an analog/digital converter (ADC) 55, a subtracter 56, a DAC 57, and a logic circuit 58. The correlated double sampling circuit 52 is connected to the input terminal CCDIN via the capacitor Cin, and a reference voltage (ground level in this example) is applied via a capacitor Cref. The subracter 53 is provided for subtracting an output of the digital-analog converter (DAC) 57 to be described later from the output of the CDS circuit 52. The PGA (Programable Gain Amp) circuit 54 is provided for amplifying an output from the subtracter 53 at a predetermined amplification factor. The analog/digital converter (ADC) 55 is provided for converting an output signal from the PGA circuit 54 into a digital signal and outputting the resulting digital output signal from the output terminal CCDOUT. The subtracter 56 is provided for subtracting a black level input signal as input via a terminal BLACK_LEVEL from the output of the ADC 55. The DAC 57 is provided for converting the output signal from the subtracter 56 into an analog value and inputting the resulting analog output signal into the substrater 53. The logic circuit 58 is provided for controlling a gain of the PGA circuit based on a digital control signal CONTROL_GAIN as output from the digital circuit.

A capacitor Cin provided between the input terminal CCDIN and the CDS circuit 52 is provided for converting a level of a CCD image signal. Further, the capacitor Cref, to one terminal of which, a predetermined reference voltage is applied, and the other terminal of which is connected to the CDS circuit 42, has the same electrostatic capacitance as the capacitor Cin. The capacitor Cref servers to reduce a common mode noise as contaminated when sampling a CCD image signal. Further, in the present embodiment, the gain of the CDS circuit 52 can be set to either 0, 6 or 12 dB. In the present embodiment, a block 59 including members 52 to 58 is integrated into one-chip together with the foregoing digital circuit.

It should be noted here that in the CCD image signal, the noise contained in the field through and the noise contained in the CCD image signal in the signal period are mutually correlated. Therefore, after sampling the field through level of the CCD image signal, the CDS circuit 52 sample-holds a CCD image signal in a signal period in which the CCD image signal has the signal level of a pixel, thereby removing the low frequency noise from the CCD image signal.

On the other hand, for the PGA circuit 54, the switched capacitor amplifier circuit 1(1*a*) of the third embodiment is adopted. The PGA circuit 54 in accordance with the present embodiment is arranged such that a gain is variable in a range of from 0 to 24 dB in the step 0.094 dB in a range of from 0 to 24 dB by adjusting the number of the capacitors C11 to C37, and switches SW11 to SW37 shown in FIG. 3, or an electrostatic capacitor value. Further, the logic circuit 58 is controlled such that the PGA circuit 54 has a gain indicated by a digital control signal CONTROL GAIN by controlling the switches SW11 to SW17, and SW31 to SW37 shown in FIG. 3.

As described, in the analog interface 51 in accordance with the present embodiment, as the PGA circuit 54, adopted is the above-explained switched capacitor amplifier 1(1*a*) which permits a precise operation at high speed. Therefore, an analog interface 51 capable of operating at high speed and outputting a high precision digital signal can be realized.

In the case of the foregoing preferred embodiment, explanations have been given through the case of applying the switched capacitor amplifier circuit 1(1*a*) to the analog interface 51 of the CCD image sensor as a non-limited example. The switched capacitor amplifier circuit 1(1*a*) of the foregoing structure increases a gain and a feedback factor and kTC noise without significantly increasing the electrostatic capacitor ratio Cmax/Cmin. Therefore, the beneficial features of the present invention will be appreciated particularly when a high gain and a high speed operation is required, and at the same time, an improved precision and a reduction in an area required are desired.

As described, the switched capacitor amplifier in accordance with the present invention is characterized by including:

a first capacitor having a first terminal and a second terminal, the first terminal being connected to a first connection point;

a second capacitor having a first terminal and a second terminal, the first terminal being connected to the first connection point; and control means which stores charges according to an input signal as input to each of the first capacitor and the second capacitor in a sampling phase, and varies a potential of the second terminal of the first capacitor and a potential of the second terminal of the second capacitor in opposite directions as a differential output while maintaining the charges at the first connection point.

According to the foregoing structure, charges according to input signals are stored in the first and second capacitors in the sampling phase. Further, in the hold phase, the control means changes the potential of the second terminal on the opposite side from the first connection point of the terminals of the first capacitor and the second capacitor while maintaining charges at the first connection point.

Here, in the case where the second terminals of the first capacitor and the second capacitor vary in mutually opposite directions, the charges at the first connection point are maintained. Therefore, by the law of conservation of charge, the following equation holds:

$$Voa \cdot Ca + Vox \cdot Cx = Via \cdot Ca + Vix \cdot Cx \quad (3),$$

wherein Ca[F], and Cx[F] indicate the electrostatic capacitance of the first capacitor, and the electrostatic capacitance of the second capacitor respectively, Via, and Vix indicate respective potentials of the first capacitor and the second capacitor before being changed respectively, and Voa and Vox indicate the respective potentials of the second terminals of the first capacitor and the second capacitor after being changed respectively.

Here, Voa and Vox are differential outputs, and thus the following equation holds:

$$Vo = (Via \cdot Ca + Vix \cdot Cx - Vc \cdot (Ca + Cx))/(Ca - Cx) \quad (4)$$

wherein Voa=Vc+Vo, and Vox=Vc−Vo.

Here, for example, under the condition of Vc=0, Via=Vix=Vi, Vo=(Ca+Cx)/(Ca−Cx)·Vi, the gain becomes (Ca+Cx)/(Ca−Cx). Further, even in the case where Vix and Via are different, the gain is given by a function of values obtained by dividing Ca or Cx by (Ca−Cx). Therefore, by making the difference between the electrostatic capacitances of the capacitors smaller, it is possible to increase a gain of the switched capacitor amplifier.

As a result, unlike the conventional structure wherein the gain is determined by Cs/Cf, even in the case where a large gain of the switched capacitor amplifier is required to be set, it is not necessary to set the ratio of the electrostatic capacitances of the capacitors large. Therefore, a switched capacitor amplifier capable of controlling variations in gain can be realized without being affected by variations in the manufacturing processes.

Further, the control means changes respective potentials of the second terminals of the first capacitor and the second capacitor in mutually opposite directions, and therefore by supplying current as received from one side to the other side, it is possible to control the potential of each terminal with a smaller driving current as compared to the conventional structure wherein only the capacitor for forming the negative feedback current is provided between the input and output terminals of the operational amplifier, without the capacitor for forming the positive feedback capacitor. Therefore, provided that the power consumption is the same, a switched capacitor amplifier which permits higher speed operation can be realized.

It may be arranged such that in the sampling phase, the same voltage is applied to the respective second terminals of the first capacitor and the second capacitor. In this case, the condition of Via=Vix holds, and thus the gain of the switched capacitor amplifier can be set to (Ca+Cx)/(Ca−Cx)

The switched capacitor amplifier of the foregoing structure may be further arranged such that a plurality of input signals are provided, and a pair of the first capacitor and the second capacitor may be provided so as to correspond to the respective input signals. In this case, the switched capacitor amplifier can output a result of a product-sum operation of input signals.

Further, the switched capacitor amplifier having the foregoing structure may be further arranged such that:

a third capacitor, a terminal on one side of which being connected to the connection point, wherein in the hold phase, the control means changes a potential of the third capacitor according to an input signal different from input signals into the first capacitor and the second capacitor while maintaining charges at the first connection point.

According to the foregoing structure, before and after changes of each of the second terminals of the first capacitor and the second terminal changes, and before and after a potential of the third capacitor changes, charges at the first connection point are stored, and the switched capacitor amplifier can output a result of a product-sum operation of each of the input signals can be output as a differential output.

Further, in this case also, a gain is derived from a function obtained by driving each electrostatic capacitance value of the first through third capacitors by a difference between the first capacitor and the second capacitor, and a gain can be increased without increasing an electrostatic capacitance ratio.

Another switched capacitor amplifier in accordance with the present invention is characterized by including:

a first capacitor having a first terminal and a second terminal, the first terminal being connected to an input terminal of an operational amplifier;

a second capacitor having a first terminal and a second terminal, the first terminal being connected to the input terminal of the operational amplifier;

a first switch which selects either an output terminal of the operational amplifier in an opposite polarity to the input terminal or a signal input terminal to which an input signal is input, and connects the terminal as selected to the second terminal of the first capacitor; and a second switch which selects either an output terminal of the operational amplifier in a same polarity to the input terminal or the signal input terminal, and connect the terminal as selected to the second terminal of the second capacitor.

According to the foregoing structure, in the state where the first switch or the second switch selects the signal input terminal, charges according to a difference between a voltage (input signal) of the signal input terminal and a voltage of the input terminal of the operational amplifier are stored in the first and second capacitors.

In this state, upon switching between the first switch and the second switch, the negative feedback circuit from the output terminal of the operational amplifier to the input terminal of the operational amplifier via the first capacitor and the positive feedback circuit from the output terminal in an opposite polarity to the output terminal to the input terminal of the operational amplifier are formed.

Here, in the transition from the state where the first switch and the second switch select the signal input terminal to the state where the positive and negative feedback circuits are formed, respective potentials of the terminals (second terminals) on the side of the first switch or the second switch of the first capacitor and the second capacitor vary in mutually opposite directions.

Therefore, the gain of the switched capacitor amplifier can be given by (Ca+Cx)/(Ca−Cx) wherein Ca and Cx indicate electrostatic capacitances of the first capacitor and the second capacitor, Vi indicates a voltage of the signal input terminal, and Vc−Vo and Vc+Vo indicate respective voltages of the output terminals of the operational amplifier.

As a result, unlike the conventional structure wherein the gain is determined by Cs/Cf, even in the case where a large gain of the switched capacitor amplifier is required to be set, it is not necessary to set the ratio of the electrostatic capacitances of the capacitors large. Therefore, a switched capacitor amplifier capable of controlling variations in gain can be realized without being affected by variations in the manufacturing processes.

The foregoing input signal is not necessarily be a differential signal but may be a signal transmitted according to one voltage level. In the case where the input signal is the differential signal, it is preferable be arranged such that:

a first input terminal to which one of differential input signals is input, and a second input terminal to which the other of the differential input signals is input are provided as the signal input terminal, and a pair of the first and second switches and the first and second capacitors are provided corresponding to a combination of a first input terminal as the signal input terminal and an inverting input terminal as an input terminal of the operational amplifier, and a combination of a second input terminal as the signal input terminal and a non-inverting input terminal as an input terminal of the operational amplifier.

According to the foregoing structure, two pairs of the first switch and the second switch, and the first capacitor and the second capacitor are provided. In this case, from the inverting output terminal of the operational amplifier, the negative feedback circuit to the non-inverting input terminal via the first capacitor, and the positive feedback circuit to the non-inverting input terminal via the second capacitor are formed. Similarly, from the non-inverting output terminal of the operational amplifier, both the negative feedback circuit to the inverting input terminal via the first capacitor and the positive feedback circuit to the non-inverting input terminal via the second capacitor are formed.

Therefore, the feedback factor of the operational amplifier is given by (Ca−Cx)/(Ca+Cx). As a result, as compared to the conventional structure wherein the gain is determined by Cs/Cf, and a feedback factor is ½×(1−Cx/Ca) wherein Cs=Ca+Cx and Cf=Ca−Cx indicate feedback factors respectively, it is possible to increase the feedback factor with respect to the same gain. As a result, a switched capacitor amplifier which permits a high speed operation can be realized.

The switched capacitor amplifier of the foregoing structure may be further arranged such that the input signal terminals are provided corresponding to a plurality of input signals respectively, and pairs of the switches and the capacitors are provided corresponding to the respective signal input terminals.

Further, the switched capacitor amplifier of the foregoing structure may be further arranged such that:

a third capacitor having a first terminal connected to an input terminal of the operational amplifier; and a third switch which switches between I) a signal input terminal, to which an input signal different from an input signal, is to be input, is connected to the second terminal of the third capacitor and II) a predetermined reference potential is applied to the second terminal of the third capacitor.

In the foregoing structure, the charges at the first connection point are stored before and after switching the first through third switches, and thus the switched capacitor amplifier can output a result of product-sum operation of respective input signals as the differential output.

In this case also, the gain is a sum of the values obtained by dividing each of the electrostatic capacitance values of the first through third capacitors by a difference between the first capacitor and the second capacitor, and a gain can be increased without increasing an electrostatic capacitance ratio. As a result, a switched capacitor amplifier which can suppress variations in gain can be realized without being affected by variations in manufacturing processes.

The switched capacitor amplifier of the foregoing structure may be arranged such that at least one of the first capacitor and the second capacitor is a variable capacitance capacitor. Further, it may be further arranged such that at least either the first capacitor or the second capacitor is a capacitor array, and either the first capacitor or the second capacitor is a capacitor array, and the capacitor array includes a plurality of capacitors, and a switch for changing an electrostatic capacitor value of the capacitor array by switching each of the capacitors.

According to the foregoing structure, at least either the first capacitor or the second capacitor changes an electrostatic capacitor value. As a result, a switched capacitor amplifier capable of adjusting a gain can be realized.

Further, the foregoing structure wherein the same voltage is applied to the respective second terminals of the first capacitor and the second capacitor in the sampling phase, or the structure provided with the first switch and the second switch, may be further arranged such that at least either one of the first capacitor and the second capacitor may be a capacitor capable of changing the electrostatic capacitor values linearly with respect to the control signals.

According to the foregoing structure, the gain is given by (Ca+Cx)/(Ca−Cx), and at least one of the first capacitor and the second capacitor is capable of changing the electrostatic capacitor values linearly, and thus a switched capacitor amplifier of a decibel-linear variable gain can be realized.

On the other hand, an analog interface circuit for the charge coupled element of the present invention is arranged so as to include a correlated double sampling circuit for carrying out a correlated double sampling with respect to an analog signal as input from a charge coupled element;

an amplifier circuit for amplifying an output signal from the correlated double sampling circuit;

an analog-digital converter for outputting an output from the amplifier circuit into a digital signal; and a digital-analog converter for compensating the output signal from said analog-digital converter with a black level compensating signal, and converting the output signal as compensated into an analog signal, and feeding back the resulting signal into an input of said amplifier circuit, wherein said amplifier circuit is any of the foregoing switched capacitor amplifiers of the present invention.

According to the foregoing structure, by the correlated double sampling circuit, a low frequency noise of an analog signal as input from the charge-coupled element is removed. Further, after being amplified by the amplifying circuit, the output of the correlated double sampling circuit is converted into a digital value, and the resulting digital signal is output. The resulting digital signal is compensated with the black level compensating signal, and is converted into an analog signal, and is fed back to the input of the amplifying circuit. As a result, since the amplifying circuit improves a gain without increasing an electrostatic capacitance ratio, variations in gain due to variations in manufacturing processes can be suppressed. As a result, an analog interface circuit for a charge coupled element capable of outputting a high precision digital signal can be realized even when setting a large gain, without increasing an electrostatic capacitance ratio.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A switched capacitor amplifier, comprising:
   a first capacitor having a first terminal and a second terminal, said first terminal being connected to a first connection point;
   a second capacitor having a first terminal and a second terminal, said first terminal being connected to said first connection point; and
   control means which stores charges according to an input signal as input to each of said first capacitor and said second capacitor in a sampling phase, and varies a potential of the second terminal of said first capacitor and a potential of the second terminal of said second capacitor in opposite directions as a differential output while maintaining the charges at said first connection point.

2. The switched capacitor amplifier as set forth in claim 1, wherein:
   said control means applies the same voltage to said second terminals of said first capacitor and said second capacitor in the sampling phase.

3. The switched capacitor amplifier as set forth in claim 1, wherein:
   a plurality of input signals are provided, and
   a pair of said first capacitor and said second capacitor is provided corresponding to the input signals respectively.

4. The switched capacitor amplifier as set forth in claim 1, further comprising:
   a third capacitor, a terminal on one side of which being connected to said connection point,
   wherein in the hold phase, said control means changes a potential of said third capacitor according to an input signal different from input signals into said first capacitor and said second capacitor while maintaining charges at said first connection point.

5. A switched capacitor amplifier, comprising:
   a first capacitor having a first terminal and a second terminal, said first terminal being connected to an input terminal of an operational amplifier;
   a second capacitor having a first terminal and a second terminal, said first terminal being connected to the input terminal of said operational amplifier;
   a first switch which selects either an output terminal of said operational amplifier in an opposite polarity to the input terminal or a signal input terminal to which an input signal is input, and connects the terminal as selected to the second terminal of said first capacitor; and
   a second switch which selects either an output terminal of said operational amplifier in a same polarity to the input terminal or the signal input terminal, and connect the terminal as selected to the second terminal of said second capacitor.

6. The switched capacitor amplifier as set forth in claim 5, wherein:
   a first input terminal to which one of differential input signals is input, and a second input terminal to which the other of the differential input signals is input are provided as said signal input terminal; and
   a pair of said first and second switches and said first and second capacitors are provided corresponding to a combination of a first input terminal as the signal input terminal and an inverting input terminal as an input terminal of said operational amplifier, and a combination of a second input terminal as the signal input terminal and a non-inverting input terminal as an input terminal of said operational amplifier.

7. The switched capacitor amplifier as set forth in claim 5, wherein:
   a plurality of signal input terminals are provided corresponding to a plurality of input signals; and
   a pair of said first and second switches and said first and second capacitors are provided corresponding to the signal input terminal respectively.

8. The switched capacitor amplifier as set forth in claim 5, further comprising:
   a third capacitor having a first terminal connected to an input terminal of said operational amplifier; and a third switch which switches between I) a signal input terminal, to which an input signal different from an input signal, is to be input, is connected to the second terminal of said third capacitor and II) a predetermined reference potential is applied to the second terminal of said third capacitor.

9. The switched capacitor amplifier as set forth in claim 1, wherein:
either said first capacitor or said second capacitor is a variable capacitance capacitor.

10. The switched capacitor amplifier as set forth in claim 5, wherein:
either said first capacitor or said second capacitor is a variable capacitance capacitor.

11. The switched capacitor amplifier as set forth in claim 1, wherein:
either said first capacitor or said second capacitor is a capacitor array, and
said capacitor array includes a plurality of capacitors, and a switch for changing an electrostatic capacitor value of said capacitor array by switching each of said capacitors.

12. The switched capacitor amplifier as set forth in claim 5, wherein:
either said first capacitor or said second capacitor is a capacitor array, and
said capacitor array includes a plurality of capacitors, and a switch for changing an electrostatic capacitor value of said capacitor array by switching each of said capacitors.

13. The switched capacitor amplifier as set forth in claim 2, wherein:
either said first capacitor or said second capacitor is arranged so as to linearly change electrostatic capacitor values with respect to control signals.

14. The switched capacitor amplifier as set forth in claim 5, wherein:
either said first capacitor or said second capacitor is arranged so as to linearly change electrostatic capacitor values with respect to control signals.

15. An analog interface circuit for a charge-coupled element, comprising:
a correlated double sampling circuit for carrying out a correlated double sampling with respect to an analog signal as input from a charge coupled element;
an amplifier circuit for amplifying an output signal from said correlated double sampling circuit;
an analog-digital converter for outputting an output from said amplifier circuit into a digital signal; and
a digital-analog converter for compensating the output signal from said analog-digital converter with a black level compensating signal, and converting the output signal as compensated into an analog signal, and feeding back the resulting signal into an input of said amplifier circuit,
wherein said amplifier circuit is a switched capacitor amplifier which includes:
a first capacitor having a first terminal and a second terminal, said first terminal being connected to a first connection point;
a second capacitor having a first terminal and a second terminal, said first terminal being connected to said first connection point; and
control means which stores charges according to an input signal as input to each of said first capacitor and said second capacitor in a sampling phase, and varies a potential of the second terminal of said first capacitor and a potential of the second terminal of said second capacitor in opposite directions as a differential output while maintaining the charges at said first connection point.

16. An analog interface circuit for a charge-coupled element, comprising:
a correlated double sampling circuit for carrying out a correlated double sampling with respect to an analog signal as input from a charge coupled element;
an amplifier circuit for amplifying an output signal from said correlated double sampling circuit;
an analog-digital converter for outputting an output from said amplifier circuit into a digital signal; and
a digital-analog converter for compensating the output signal from said analog-digital converter with a black level compensating signal, and converting .the output signal as compensated into an analog signal, and feeding back the resulting signal into an input of said amplifier circuit,
wherein said amplifier circuit is a switched capacitor amplifier which includes:
a first capacitor having a first terminal and a second terminal, said first terminal being connected to an input terminal of an operational amplifier;
a second capacitor having a first terminal and a second terminal, said first terminal being connected to the input terminal of said operational amplifier;
a first switch which selects either an output terminal of said operational amplifier in an opposite polarity to the input terminal or a signal input terminal to which an input signal is input, and connects the terminal as selected to the second terminal of said first capacitor; and
a second switch which selects either an output terminal of said operational amplifier in a same polarity to the input terminal or the signal input terminal, and connect the terminal as selected to the second terminal of said second capacitor.

* * * * *